United States Patent [19]

Kamiya et al.

[11] Patent Number: 4,622,656
[45] Date of Patent: Nov. 11, 1986

[54] NON-VOLATILE SEMICONDUCTOR MEMORY

[75] Inventors: Masaaki Kamiya; Yoshikazu Kojima, both of Tokyo, Japan

[73] Assignee: Seiko Instruments & Electronics Ltd., Tokyo, Japan

[21] Appl. No.: 561,728

[22] Filed: Dec. 15, 1983

[30] Foreign Application Priority Data

Dec. 16, 1982 [JP] Japan ................... 57-220838

[51] Int. Cl.$^4$ .................................................. G11C 11/40
[52] U.S. Cl. ...................................... 365/185; 365/189; 365/51; 357/23.5
[58] Field of Search ................ 365/185, 189, 182, 51; 307/304; 357/23.5

[56] References Cited

U.S. PATENT DOCUMENTS 4,305,083 12/1981 Gutierrez .......................... 365/185
4,513,397 4/1985 Ipri et al. .......................... 365/185

Primary Examiner—Terrell W. Fears
Attorney, Agent, or Firm—Robert E. Burns; Emmanuel J. Lobato; Bruce L. Adams

[57] ABSTRACT

This invention relates to the reduction of programming voltage in a non-volatile memory of the type having a double gate structure composed of a select-gate and a floating-gate. A channel region under the select-gate is highly doped and a channel region under the floating gate is lightly doped or doped to opposite conductivity type. Due to the different doping concentrations between these two channel regions, a large and steep surface potential gap appears at the transition region between the select-gate and the floating-gate in the programming operation thereby reducing the programming voltage.

27 Claims, 5 Drawing Figures

NON-VOLATILE SEMICONDUCTOR MEMORY

BACKGROUND OF THE INVENTION

The present invention relates to a floating gate-type non-volatile semiconductor memory of MOS structure, and more particularly, to a non-volatile semiconductor memory capable of writing electric charges in a floating gate electrode with a low voltage and a high injection efficiency.

Conventionally, a writing (injecting electric charges into a floating gate electrode) voltage of a floating gate-type non-volatile semiconductor memory using a channel injection method is generally no less than 15 V. And even in an improved memory, a writing voltage of no less than 7 V is required. In accordance with the unification of an operation voltage of a circuit system to 5 V, the requirement for a non-volatile semiconductor memory capable of being written and read at 5 V has been on the rise.

FIG. 1 shows a sectional view of a conventional floating gate-type non-volatile semiconductor memory capable of being written by channel injection at around 7 V. An n+ source region 2 and an n+ drain region 3 are formed on a P-type silicon semiconductor substrate 1 (a P-well formed on a n-type substrate can also be used), and the source and drain regions are connected to the outside by electrodes 8 and 9. The source region 2 and drain region 3 define therebetween a channel region having a first channel region portion $l_1$ and a second channel region portion $l_2$, the two channel region portions $l_1$ and $l_2$ contacting one another in between the source and drain regions. On the drain region 3 and on the channel region portion $l_2$ contiguous to the drain region 3 is formed a floating gate electrode 6 made of poly-crystal silicon through a thin (e.g. 100 Å–200 Å) gate oxide film 5 and electrically isolated by an oxide film 10. On the channel region portion $e_1$ which is in contact with the source region 2 is formed a selective gate electrode 7 through a gate oxide film 4.

The electric potential $V_F$ of the floating gate electrode 6 is controlled by the drain voltage $V_D$ applied to the drain region 3 by electrostatic capacitance coupling between the drain region 3 and the floating gate electrode 6. In case no electrons are fed to the floating gate electrode 6, for example, the electric potential $V_F$ of the floating gate region 6 becomes at around 7 V by applying $V_D = 7$ V to the drain region 3. Accordingly the surface electric potential $\phi SF$ of the channel region under the floating gate electrode 6 approaches the electric potential of the drain region 3. On the other hand, when a voltage almost equivalent to the threshold voltage of the selective gate electrode 7 is applied, the surface electric potential $\phi SS$ of the channel region under the selective gate electrode 7 becomes almost equivalent to the electric potential of the source region 2. The surface electric potential $\phi S$ steeply changes from $\phi SS$ to $\phi SF$ near the channel region under the border of the selective gate electrode 7 and the floating gate electrode 6. At this time, electrons are accelerated in the electric field to become hot electrons and jump into the floating gate electrode 6. The electrons can be injected into the floating gate electrode 6 only when the surface electric potential difference $\Delta\phi S$ is larger than the electric potential barrier 3.2 V between the silicon substrate 1 and the silicon oxide film 5 and the surface electric potential $\phi S$ steeply changes.

FIG. 2 shows an example of the distribution of the surface electric potential $\phi S$ of the memory shown in FIG. 1 when in the writing mode. Regions I, II, III and IV corresponds respectively to the source region 2, the channel region portion $l_1$ under the selective gate electrode 7, the channel region portion $l_2$ under the floating gate electrode 6, and the drain region 3. The solid line indicates the distribution of the surface electric potential $\phi S$ in the case where the impurity density of the P-type substrate 1 is high. It shows that there exists a drop of the surface electric potential $\phi S$ in the region III near the region IV. The drop of the surface electric potential $\phi S$ is caused by the electric potential of the floating gate electrode 6 being incapable of sufficiently inverting the surface thereunder if the impurity density of the substrate 1 is high. The surface electric potential difference or drop $\Delta\phi S$ at the border of the region II and the region III becomes smaller by a reduction of the surface electric potential $\phi S$, which results in disturbance of a reduction in the writing voltage. The broken line shows the distribution of the surface electric potential $\phi S$ in the case where the impurity density of the P-type substrate 1 is low. No drop of the surface electric potential $\phi S$ in the region III is found and the variation of the potential $\phi S$ in the region II is relaxed, whereby the probability of generating hot electrons with high energy becomes smaller.

As illustrated, a reduction in the writing voltage is difficult in the conventional non-volatile semiconductor memory.

SUMMARY OF INVENTION

Accordingly, it is an object of the invention to provide a non-volatile semiconductor memory having a comparatively low writing voltage.

DESCRIPTION OF THE PREFERRED EMBODIMENTS

Figure 1:
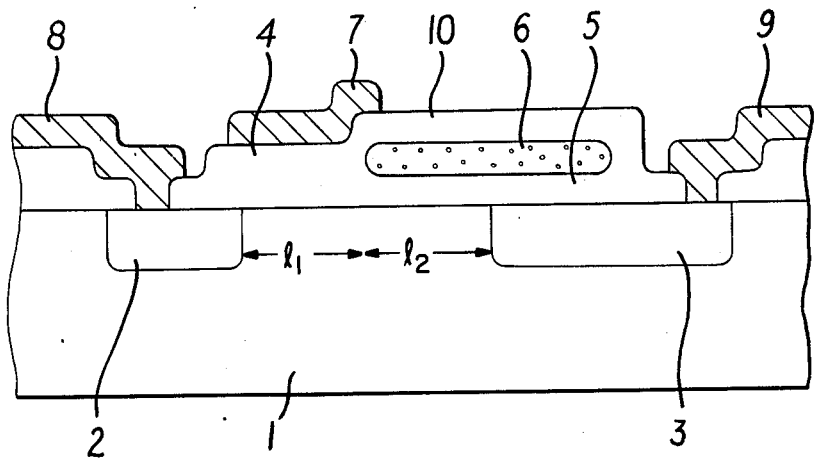
FIG. 1 is a sectional view showing a conventional non-volatile semiconductor memory.
Figure 2:
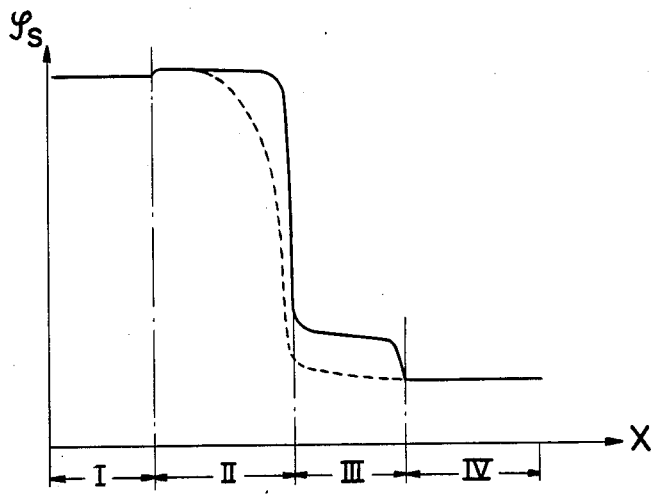
FIG. 2 shows the distribution of the electric potential on the surface of the non-volatile semiconductor memory in FIG. 1 in the writing.
Figure 3:
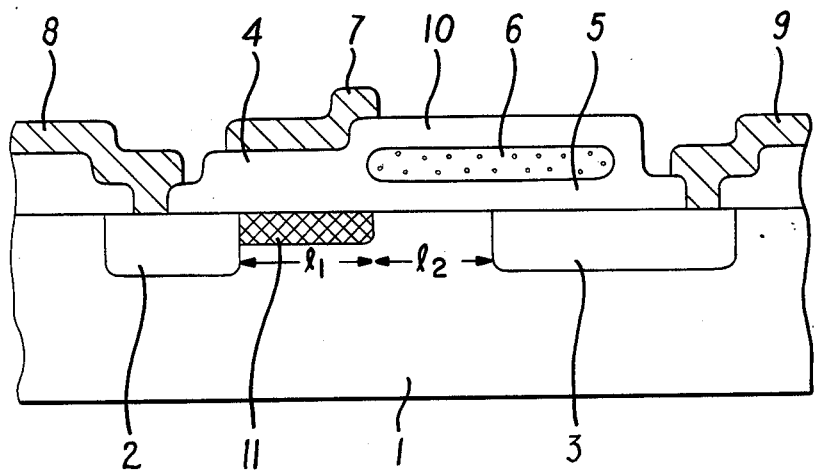
FIG. 3 is a sectional view showing an embodiment of a non-volatile semiconductor memory according to the present invention.
Figure 4:
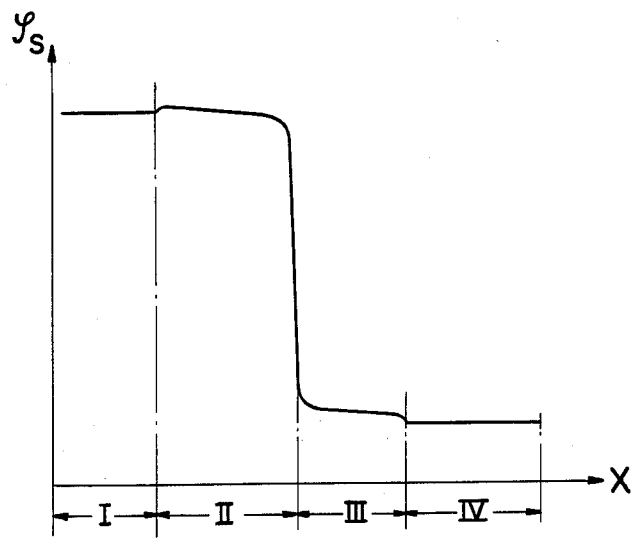
FIG. 4 is the distribution of the electric potential on the surface of the non-volatile semiconductor memory in FIG. 3 in the writing mode.
Figure 5:
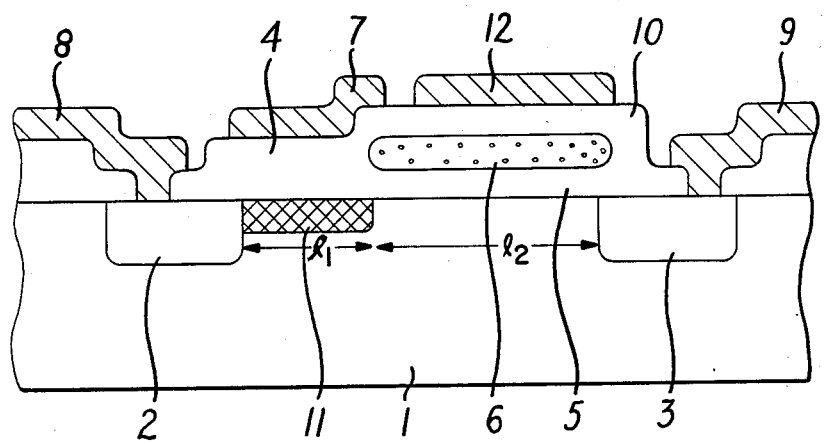
FIG. 5 is a sectional view showing another embodiment of the present invention.

A non-volatile semiconductor memory according to the present invention will be in accordance with FIGS. 3–5.

FIG. 3 is a sectional view showing an embodiment of a non-volatile semiconductor memory according to the present invention, in which a P-type high density impurity region 11 is formed under the selective gate electrode 7 to define the channel region portion $l_1$.

FIG. 4 shows the distribution of the surface electric potential $\phi S$ in applying a voltage near the threshold voltage to the selective gate electrode 7 and applying a voltage necessary for writing to the drain region 3 in the memory shown in FIG. 3. The regions I, II, III and IV correspond respectively to the source region 2, the channel region portion $l_1$ under the selective gate electrode 7, the channel region portion $l_2$ under the floating gate electrode 6, and the drain region in FIG. 3. By lowering the impurity density of the P-type substrate 1, the surface electric potential $\phi S$ of the region III can be lowered to approach that of the surface electric potential of the region IV (drain region 3). The surface electric potential $\phi S$ of the channel region portions $l_1$ under the selective gate electrode 7 is kept substantially constant over the entire region II excepting the vicinity of the border of the region II and the region III where the channel region portions $l_1$ and $l_2$ contact each other owing to the high density impurity region 11, and the surface electric potential changes largely and steeply near the border. Accordingly, the energy of the hot electrons becomes higher, and electric charges escaping from the source region 2 are accelerated and injected into the floating gate and thus can be written at a low drain voltage (e.g. 5 V). Moreover, since the efficiency of injecting the channel electrons into the floating gate is higher, the electric charges can be written with a low current consumption.

On the other hand, reading of the memory is enabled by changing the drain voltage in accordance with the amount of electrons in the floating gate electrode 6 by applying a voltage to the selective gate electrode 7 in order to sufficiently invert the channel region thereunder and further by flowing a reading current $I_R$ in the drain region 3. This is because, in the writing mode in which a number of electrons are injected into the floating gate electrode 6, the threshold voltage is high, whereas in the non-writing mode in which no electrons are injected, the threshold voltage is low. In case electric charges are read at the same voltage condition as in the writing mode for the memory, unexpected injection of electrons may occur. This can be prevented if a voltage sufficiently higher than the threshold voltage of the selective gate electrode 7 is applied to the selective gate electrode 7, whereby a comparatively large inclination of the surface electric potential $\phi S$ over the whole area of the region II and the region III is produced, and the drop of the surface electric potential $\Delta \phi S$ at the border of the region II and the region III can be reduced.

FIG. 5 is a sectional view showing another embodiment of the present invention. The drain voltage $V_{DD}$ controls the electric potential of the floating gate electrode 6 in FIG. 3, while a gate electrode 12 for exclusively controlling the electric potential of the floating gate electrode 6 is formed thereon in FIG. 5. Although the operation of the embodiment in FIG. 5 as a non-volatile semiconductor memory is the same as that of FIG. 3, the dimension of the device is further reduced in the embodiment of FIG. 5.

As described, the present invention realizes a non-volatile semiconductor memory whose current consumption in the writing mode is reduced.

Although the present invention has been illustrated with respect to an N-type memory cell using a P-type silicon substrate by way of example, it is to be noted that a P-type memory cell using an N-type silicon substrate can be formed in a similar way. Further, although the present invention has been illustrated with respect to a memory in which a high density impurity region is formed under a selective gate electrode, it is readily apparent from the above description that a similar effect can be attained by a memory in which a substrate includes a high density impurity and a low density impurity region is formed under a floating gate electrode.

What is claimed is:

1. A non-volatile semiconductor memory comprising:
   a first conductivity-type semiconductor region;
   a second conductivity-type source and drain regions formed on said first conductivity-type semiconductor region and separated from each other by a certain distance;
   a first channel region formed between said source region and said drain region and being in contact with said source region;
   a second channel region formed between said first channel region and said drain region;
   a first gate insulating film formed on said first channel region;
   a second gate insulating film formed on said second channel region;
   a first gate electrode formed on said first gate insulating film;
   and a floating gate electrode formed on said second gate insulating film;
   wherein said semiconductor region has a first conductivity-type impurity density in the proximity of said first channel region which is sufficiently higher than the impurity density in the proximity of said second channel region to accelerate part of the channel current electrons and inject them into said floating gate electrode at a location where said first channel region is in contact with said second channel region.

2. A non-volatile semiconductor memory as clained in claim 1, wherein said higher-density impurity region in the proximity of said first channel region comprises an ion-implanted impurity region.

3. A non-volatile semiconductor memory as claimed in claim 1, wherein said lower-density impurity region in the proximity of said second channel region comprises an ion-implanted impurity region of said second conductivity-type.

4. A non-volatile semiconductor memory as claimed in claim 1, wherein said second gate insulating film and said floating gate electrode are formed on said second channel region but not on said first channel region or said drain region, and a second gate electrode is formed on said floating gate electrode via an insulating film.

5. A non-volatile semiconductor memory as claimed in claim 1, including means for applying a voltage near the threshold voltage of said first channel region to said first gate electrode, and means for applying a predetermined programming voltage to said drain region to effect injection of electric charges into said floating gate electrode.

6. A non-volatile semiconductor memory as claimed in claim 4, including means for applying a voltage near the threshold voltage of said first channel region to said first gate electrode, and means for applying predetermined programming voltage to said drain region and said second gate electrode to effect injection of electric charges into said floating gate electrode.

7. A non-volatile semiconductor memory as claimed in claim 1, including means for applying a voltage sufficiently higher than the threshold voltage of said first channel to said first gate electrode to enable the reading of electric charge information of said floating gate electrode according to the conductivity state between said source region and said drain region.

8. A non-volatile semiconductor memory as claimed in claim 2, wherein said lower-density impurity region in the proximity of said second channel region comprises an ion-implanted impurity region of said second conductivity-type.

9. A non-volatile semiconductor memory as claimed in claim 2, wherein said second gate insulating film and said floating gate electrode are formed on said second channel region but not on said first channel region or said drain region, and a second gate electrode is formed on said floating gate electrode via an insulating film.

10. A non-volatile semiconductor memory as claimed in claim 3, wherein said second gate insulating film and said floating gate electrode are formed on said second channel region but not on said first channel region or said drain region, and a second gate electrode is formed on said floating gate electrode via an insulating film.

11. A non-volatile semiconductor memory as claimed in claim 2, including means for applying a voltage near the threshold voltage of said first channel region to said first gate electrode, and means for applying a predetermined programming voltage to said drain region to effect injection of electric charges into said floating gate electrode.

12. A non-volatile semiconductor memory as claimed in claim 3, including means for applying a voltage near the threshold voltage of said first channel region to said first gate electrode, and means for applying a predetermined programming voltage to said drain region to effect injection of electric charges into said floating gate electrode.

13. A non-volatile semiconductor memory as claimed in claim 2, including means for applying a voltage near the threshold voltage of said first channel region to said first gate electrode, and means for applying predetermined programming voltage to said drain region and said second gate electrode to effect injection of electric charges into said floating gate electrode.

14. A non-volatile semiconductor memory as claimed in claim 3, including means for applying a voltage near the threshold voltage of said first channel region to said first gate electrode, and means for applying predetermined programming voltage to said drain region and said second gate electrode to effect injection of electric charges into said floating gate electrode.

15. A non-volatile semiconductor memory as claimed in claim 2, including means for applying a voltage sufficiently higher than the threshold voltage of said first channel to said first gate electrode to enable the reading of electric charge information of said floating gate electrode according to the conductivity state between said source region and said drain region.

16. A non-volatile semiconductor memory as claimed in claim 3, including means for applying a voltage sufficiently higher than the threshold voltage of said first channel to said first gate electrode to enable the reading of electric charge information of said floating gate electrode according to the conductivity state between said source region and said drain region.

17. A non-volatile semiconductor memory as claimed in claim 4, including means for applying a voltage sufficiently higher than the threshold voltage of said first channel to said first gate electrode to enable the reading of electric charge information of said floating gate electrode according to the conductivity state between said source region and said drain region.

18. A non-volatile semiconductor memory as claimed in claim 5, including means for applying a voltage sufficiently higher than the threshold voltage of said first channel to said first gate electrode to enable the reading of electric charge information of said floating gate electrode according to the conductivity state between said source region and said drain region.

19. A non-volatile semiconductor memory as claimed in claim 6, including means for applying a voltage sufficiently higher than the threshold voltage of said first channel to said first gate electrode to enable the reading of electric charge information of said floating gate electrode according to the conductivity state between said source region and said drain region.

20. A non-volatile semiconductor memory comprising: a semiconductor region of one conductivity type; a source region and a drain region disposed in spaced-apart isolation from one another in the semiconductor region adjacent to the surface thereof to define a channel region in the semiconductor region extending between the source and drain regions, the channel region comprising a first channel region portion in contact with the source region and a second channel region portion in contact with the drain region, the first and second channel region portions being in contact with one another in between the source and drain regions; a first gate insulating film formed on the first channel region portion; a second gate insulating film formed on the second channel region portion; a select gate electrode formed on the first gate insulating film; a floating gate electrode formed on the second gate insulating film; and means including different doping concentrations in the first and second channel region portions for establishing, in the proximity of the semiconductor region surface, a surface electric potential having a gradient which is steep enough at the place where the first and second channel region portions contact one another to accelerate electrons emanating from the source region and inject the accelerated electrons into the floating gate electrode at a location along the channel region where the first channel region portion contacts with the second channel region portion.

21. A non-volatile semiconductor memory according to claim 20; wherein the means including different doping concentrations in the first and second channel region portions comprises the first channel region portion having an impurity density of said one conductivity type which is higher than that of the second channel region portion.

22. A non-volatile semiconductor memory according to claim 21; wherein the first channel region portion has ion-implanted impurities which define the impurity density thereof.

23. A non-volatile semiconductor memory according to claim 22; wherein the second channel region has ion-implanted impurities which define the impurity density thereof.

24. A non-volatile semiconductor memory according to claim 23; wherein the impurity density of the second channel region portion is of said one conductivity type.

25. A non-volatile semiconductor memory according to claim 23; wherein the impurity density of the second channel region portion is of a conductivity type which is opposite to said one conductivity type.

26. A non-volatile semiconductor memory according to claim 21; wherein the impurity density of the second channel region portion is of said one conductivity type.

27. A non-volatile semiconductor memory according to claim 21; wherein the impurity density of the second channel region portion is of a conductivity type which is opposite to said one conductivity type.

* * * * *